(12) United States Patent
Okumoto et al.

(10) Patent No.: US 8,445,895 B2
(45) Date of Patent: May 21, 2013

(54) ORGANIC ELECTROLUMINESCENCE ELEMENT

(75) Inventors: Kenji Okumoto, Kyoto (JP); Jeremy Burroughes, Cambridge (GB); Julian Carter, Cambridgeshire (GB)

(73) Assignees: Panasonic Corporation, Osaka (JP); Cambridge Display Technology Ltd., Cambridgeshire (GB)

( * ) Notice: Subject to any disclaimer, the term of this patent is extended or adjusted under 35 U.S.C. 154(b) by 333 days.

(21) Appl. No.: 12/791,392

(22) Filed: Jun. 1, 2010

(65) Prior Publication Data

US 2010/0237341 A1 Sep. 23, 2010

Related U.S. Application Data

(63) Continuation of application No. PCT/JP2009/002347, filed on May 27, 2009.

(30) Foreign Application Priority Data

Jun. 2, 2008 (GB) .................................. 0810044.8

(51) Int. Cl.
*H01L 29/08* (2006.01)
*H01L 35/24* (2006.01)
*H01L 51/00* (2006.01)

(52) U.S. Cl.
USPC ............. 257/40; 428/690; 977/734; 977/720; 977/721; 977/722; 438/46; 257/E51.018

(58) Field of Classification Search
USPC ............... 428/690; 438/46; 257/40, E51.018, 257/E51.022, 86, 87; 977/720, 721, 722, 977/734
See application file for complete search history.

(56) References Cited

U.S. PATENT DOCUMENTS

| 6,284,393 B1 | 9/2001 | Hosokawa et al. |
| 7,012,364 B2 | 3/2006 | Mori et al. |
| 7,521,113 B2 | 4/2009 | Lu et al. |

(Continued)

FOREIGN PATENT DOCUMENTS

| CN | 1820552 | 8/2006 |
| JP | 10-162959 | 6/1998 |

(Continued)

OTHER PUBLICATIONS

United Kingdom Office action that issued with respect to patent family member United Kingdom Patent Application No. 0810044.8, mail date is Oct. 14, 2011.

(Continued)

*Primary Examiner* — Jarrett Stark
(74) *Attorney, Agent, or Firm* — Greenblum & Bernstein, P.L.C.

(57) ABSTRACT

An organic electroluminescence element having a cathode as a top electrode, and excelling in luminance efficiency, drive voltage, and operational life is provided. The organic electroluminescence element includes an anode over a substrate and a luminescent layer over the anode. The luminescent layer comprises an organic material. An electron injection layer is over the luminescent layer for injecting electrons into the luminescent layer. The electron injection layer is a metal including at least one of an alkaline metal and an alkaline earth metal. A fullerene layer is over the electron injection layer and includes fullerenes and at least one of an alkaline metal and an alkaline earth metal. The at least one of the alkaline metal and the alkaline earth metal included in the fullerene layer has a lower work function than a lowest unoccupied molecular orbit energy level of the fullerenes. A cathode is over the fullerene layer.

17 Claims, 5 Drawing Sheets

U.S. PATENT DOCUMENTS

| | | | |
|---|---|---|---|
| 7,528,541 | B2 | 5/2009 | Kasama et al. |
| 2004/0214041 | A1 | 10/2004 | Lu et al. |
| 2004/0245917 | A1 | 12/2004 | Lu et al. |
| 2005/0127824 | A1 | 6/2005 | Mori et al. |
| 2005/0248265 | A1 | 11/2005 | Sung |
| 2006/0006796 | A1 | 1/2006 | Lee et al. |
| 2006/0099448 | A1 | 5/2006 | Lu et al. |
| 2006/0105200 | A1 | 5/2006 | Poplavskyy et al. |
| 2006/0226770 | A1 | 10/2006 | Lee et al. |
| 2006/0238112 | A1 | 10/2006 | Kasama et al. |
| 2007/0181874 | A1 | 8/2007 | Prakash et al. |
| 2010/0051902 | A1 | 3/2010 | Hiura et al. |
| 2010/0187513 | A1 | 7/2010 | Okumoto |
| 2010/0258833 | A1 | 10/2010 | Okumoto et al. |

FOREIGN PATENT DOCUMENTS

| | | |
|---|---|---|
| JP | 2000-260572 | 9/2000 |
| JP | 2004-127740 | 4/2004 |
| JP | 2004-327436 | 11/2004 |
| WO | 2004/095507 | 11/2004 |
| WO | 2008/062642 | 5/2008 |

OTHER PUBLICATIONS

China Office action that issued with respect to patent family member Cginese patent Applicatipon No. 200980119441.0, mail date is Apr. 28, 2012.

Masayuki Chikamatsu et al., "Mg-doped C60 Thin Film as Improved n-type Organic Semiconductor for a Solar Cell", Applied Physics Letters, vol. 84, No. 1, Jan. 2004, pp. 127-129.

M. Pope et al., "Electroluminescence in Organic Crystals*", Letters to the Editor (Received Dec. 10, 1962), , pp. 2042-2043.

C. W. Tang et al., "Organic Electroluminescent Diodes", Appl. Phys. Lett. 51 (12), American Institute of Physics, Sep. 1987, pp. 913-915.

J. H. Burroughes et al., "Light-Emitting Diodes Based on Conjugated Polymers", Nature, vol. 347, Oct. 1990, pp. 539-541.

C. Fery et al., "Physical Mechanism Responsible for the Stretched Exponential Decay Behavior of Aging Organic Light-Emitting Diodes", Applied Physics Letters 87, 213502 (2005), , pp. 213502-1-213502-3.

U.S. Appl. No. 12/855,027 to Kenji Okumoto, which was filed on Aug. 12, 2010.

U.S. Appl. No. to Kenji Okumoto et al., which was filed on Jan. 1, 1900.

FIG. 7

| Number | Element structure | Drive voltage (V) | Luminescence efficiency (cd/A) | Element operational life (hour) |
|---|---|---|---|---|
| Example 1 | MoCr Alloy electrode/ITO supplementary electrode/PEDOT hole injection layer/IL hole transport layer/EML Luminescent layer/Ba electrode injection layer/(10 nm) C60 Fullerene layer/ITO transparent cathode | 8.0 | 7.2 | 140 |
| Example 2 | MoCr Alloy electrode/ITO supplementary electrode/PEDOT hole injection layer/IL hole transport layer/EML Luminescent layer/Ba electrode injection layer/(20 nm) C60 Fullerene layer/ITO transparent cathode | 8.0 | 8.1 | 180 |
| Example 3 | MoCr Alloy electrode/ITO supplementary electrode/PEDOT hole injection layer/IL hole transport layer/EML Luminescent layer/Ba electrode injection layer/(50 nm) C60 Fullerene layer/ITO transparent cathode | 10.1 | 5.2 | 100 |
| Example 4 | MoCr Alloy electrode/ITO supplementary electrode/PEDOT hole injection layer/IL hole transport layer/EML Luminescent layer/Ba electrode injection layer/(10 nm) C60+Ba Fullerene layer/ITO transparent cathode | 7.2 | 7.5 | 140 |
| Example 5 | MoCr Alloy electrode/ITO supplementary electrode/PEDOT hole injection layer/IL hole transport layer/EML Luminescent layer/Ba electrode injection layer/(20 nm) C60+Ba Fullerene layer/ITO transparent cathode | 7.3 | 8.2 | 170 |
| Example 6 | MoCr Alloy electrode/ITO supplementary electrode/PEDOT hole injection layer/IL hole transport layer/EML Luminescent layer/Ba electrode injection layer/(50 nm) C60+Ba Fullerene layer/ITO transparent cathode | 7.4 | 6.8 | 130 |
| Comparative example 1 | MoCr Alloy electrode/ITO supplementary electrode/PEDOT hole injection layer/IL hole transport layer/EML Luminescent layer/Ba electrode injection layer/ITO transparent cathode | 10.2 | 2.1 | <1.0 |
| Comparative example 2 | MoCr Alloy electrode/ITO supplementary electrode/PEDOT hole injection layer/IL hole transport layer/EML Luminescent layer/(20 nm) Alq+Ba low-molecular-weight organic layer/ITO transparent cathode | 10.5 | 7.0 | 80 |
| Comparative example 3 | MoCr Alloy electrode/ITO supplementary electrode/PEDOT hole injection layer/IL hole transport layer/EML Luminescent layer/(20 nm) C60+Ba Fullerene layer/ITO transparent cathode | 8.5 | 1.5 | 40 |

ORGANIC ELECTROLUMINESCENCE ELEMENT

CROSS REFERENCE TO RELATED APPLICATION(S)

This is a continuation application of PCT Application No. PCT/JP2009/002347 filed May 27, 2009, designating the United States of America, the disclosure of which, including the specification, drawings, and claims, is incorporated herein by reference in its entirety.

The disclosure of United Kingdom Patent Application No. 0810044.8 filed on Jun. 2, 2008, including the specification, drawings and claims, is incorporated herein by reference in its entirety.

BACKGROUND OF THE INVENTION

1. Field of the Invention

The present invention relates to organic electroluminescence elements, and particularly to an organic electroluminescence element used in display devices and lighting, and manufacturing method thereof.

2. Description of the Related Art

An element from which luminescence (electroluminescence) can be obtained by applying voltage to a thin film of organic material sandwiched between two electrodes is called an organic electroluminescence element (hereafter called organic EL element). An organic EL element using an organic low-molecular-weight material was discovered in the 1960's (see Non-Patent Reference 1: M. Pope et al., Journal of Chemical Physics vol. 38, pages 2042 to 2043; 1963), and the element structure and practical processes were developed in the 1980's (see Non-Patent Reference 2: C. W. Tang and S. A. Vanslyke, Applied Physics Letters vol. 51, pages 913 to 915; 1987). An organic EL element using an organic low-molecular-weight material is characterized in having few pixel defects since the organic thin film thereof is prepared by vacuum deposition in which mixing-in of impurities and dust in a process under vacuum is low. Subsequently, in the first half of the 1990's, an organic EL element using polymeric molecules was reported (see Non-Patent Reference 3: J. H. Burroughes et al., Nature vol. 347, pages 539 to 541; 1990). An organic EL element using polymeric material is characterized in that a convenient process under atmospheric pressure is used and material loss is low, since the organic thin film thereof is prepared by applying, through a wet process, a liquid solution or dispersion liquid obtained as a result of dissolving polymeric molecules in a solvent. Both organic EL elements are characterized in being self-luminous and bright, having low viewing angle dependency, facilitating area-enlargement and fine-arraying, and so on, and are being developed as a source of luminescence in a display and a light source for lighting.

FIG. 1 is a structural cross-section view of the conventional organic EL element described in Non-Patent Reference 2. An organic EL element 500 described in FIG. 1 includes a transparent substrate 501, a transparent bottom electrode 502, an organic layer 503, and an opaque top electrode 504. The transparent bottom electrode 502 is laminated on the transparent substrate 501 in a structure that allows luminescence from the organic layer 503 to be retrieved from the substrate-side. A metal electrode is used as the opaque top electrode 504, and the luminescence from the organic layer 503 is reflected. Hereinafter, an organic EL element having the same structure as the organic EL element 500 shall be described as a bottom emission organic EL element.

In contrast, FIG. 2 is a structural cross-section view of the conventional organic EL element having a structure that allows the luminescence from the organic layer to be retrieved from the top electrode-side (see Patent Reference 1: Japanese Unexamined Patent Application Publication No. 10-162959, and so on). An organic EL element 600 described in FIG. 2 includes an opaque substrate 601, an opaque bottom electrode 602, an organic layer 603, and a transparent top electrode 604. The opaque bottom electrode 602 is laminated on the opaque substrate 601 in a structure that allows luminescence from the organic layer 603 to be retrieved from the transparent top electrode 604. Hereinafter, an organic EL element having the same structure as the organic EL element 600 shall be described as a top emission organic EL element.

When considering the applicability to an active matrix-type organic EL display including an organic EL element and a thin film transistor (hereafter called TFT) driving such organic EL element, the top emission organic EL element is more suitable than the bottom emission organic EL element. This is because, since luminescence is retrieved from the substrate-side in the case of the bottom emission organic EL element, the area of the pixel area that can be occupied by an organic EL luminescence unit is limited to an area on the substrate other than that for the opaque TFT and electrical wiring. At the same time, the area for TFT and electrical wiring within a pixel needs to be minimized since securing an area for the organic EL element is prioritized, thus placing a constraint on design freedom.

In contrast, since luminescence is retrieved from the side opposite the substrate in the case of the top emission organic EL element, the organic EL element can be formed on top of the TFT layer on the substrate-side, and the area of the TFT layer can be widened as much as the pixel area. Accordingly, since it is possible to increase the amount of current supplied to the organic EL element since the TFT channel width is enlarged, or it is possible to increase the number of TFTs and form a current compensation circuit, the in-plane luminance distribution of the display becomes uniform. In addition, since the portion of the organic EL element area occupying the pixel area increases, the luminescence load per unit pixel decreases and the operational life of the display improves.

In particular, in the top emission organic EL element which is highly advantageous in applications for displays, a metallic oxide electrode such as an indium tin oxide (hereafter called ITO) electrode is used as the electrode for the transparent top electrode 604. Since it is difficult to form these into a thin film having satisfactory transparency and conductivity by resistance heating deposition, the sputtering method and other film-forming methods using plasma are used.

Furthermore, generally speaking, in the organic EL element structure, the bottom electrode is an anode, and the top electrode is a cathode. Particularly, in the case of an organic EL element using organic polymeric molecules, a polymer layer is formed by a wet process such as the spin coat process or inkjet process. Alkaline metal, alkaline earth metal, or salts thereof, used as a cathode having a function for supplying electrodes, react with water or oxygen and easily become unstable. Therefore, in the case where a cathode is the bottom electrode, the alkaline metal, alkaline earth metal, or salts thereof, making up the bottom electrode reacts with the organic layer which is a liquid layer at the initial stage of forming, and mutual elution or mutual dispersion occurs at the lamination interface, and thus control of the lamination interface becomes difficult. From this perspective as well, the structure in which a cathode is the top electrode is adopted.

As described above, in the case where the transparent top electrode represented by ITO is a cathode, an electron injecting layer having the following characteristics-conditions is needed between the transparent cathode and the organic luminescent layer, in order to inject electrons into the organic luminescent layer.

(1) Promotes electron injection from the transparent cathode to the organic luminescent layer, (2) Protects the organic luminescent layer from damage during transparent cathode film-forming, and (3) Optical transparency is high.

(1) is because, the transparent top electrode of a metallic oxide represented by ITO has, from its work function, excellent hole injecting characteristics but has poor electron injecting characteristics, and the electron injecting characteristics needs to be supplemented. (2) is for protecting the organic luminescent layer from plasma damage leading to the deterioration of luminescence efficiency, the rise of drive voltage, and the deterioration of the operational life of the element, since the film-forming method for the metallic oxide such as ITO is a film-forming method using plasma. (3) is for the transmission of the luminescence of the organic luminescent layer.

In order to satisfy the aforementioned requirements for an electron injection layer, conventional organic EL elements are disclosed in Patent Reference 2: Japanese Unexamined Patent Application Publication No. 2004-127740, Patent Reference 3: Japanese Unexamined Patent Application Publication No. 2000-260572, Patent Reference 4: Japanese Unexamined Patent Application Publication No. 2004-327436, and so on.

In Patent Reference 2, a metal-doped organic material is used as a lower layer of a transparent electrode, and with the existence of the metal-doped organic material, damage to the organic luminescent layer during the forming of the transparent cathode is reduced and electron injection is promoted. As the organic material used in the metal-doped organic material layer, a generally used π (pi) electron low-molecular-weight electron transport material has been proposed.

Furthermore, Patent Reference 3 discloses the use of metal-doped fullerenes.

Furthermore, in Patent Reference 4, electron transporting characteristics exhibiting ohmic behavior are realized by using a layer including fullerenes as an electron transport layer, and forming in the following order: a layer including an alkaline fluoride, in the upper layer or lower layer of the electron transport layer; and then an upper electrode including a conductive material.

SUMMARY OF THE INVENTION

However, with the π (pi) electron low-molecular-weight electron transport material described in Patent Reference 2, damage from sputter damage is significant and, although damage to the organic luminescent layer is reduced, there is the problem that the layer of the electron transport material itself is damaged, leading to the instability of the element, the rise of drive voltage, and so on.

Furthermore, although the fullerenes described in Patent Reference 3 have high damage resistance against sputter, plasma, and the like, when the fullerenes come directly into contact with the organic luminescent layer, there is an energy transfer of the luminescence exciton energy generated within the organic luminescent layer during driving of the organic EL, to the fullerene layer, and thus luminescence efficiency deteriorates. In other words, there is the problem that the fullerenes cause optical-quenching of the luminescence of the organic luminescent layer, which greatly reduces the luminescence efficiency of the element.

Furthermore, the alkaline fluoride described in Patent Reference 4 is oxidized by the cathode of a transparent oxide such as ITO, used as the upper electrode including a conductive material, and there is a problem that the stability and operational life of the organic EL element significantly deteriorates.

Furthermore, in the case where a fullerene layer is laminated in the upper layer of the layer including alkaline fluoride, there is the problem that alkaline fluoride is not sufficiently reduced to the metal state required for implementing electron injection, and good electron injection to the organic luminescent layer cannot be obtained.

As described above, although various structures have been proposed for cathodes of ITO and the like as a top electrode, it has not been possible to obtain a structure that satisfies all the required elements for display devices, namely, element stability, low drive voltage, and high luminance efficiency.

In view of the aforementioned problems, the present invention has as an object to provide an organic EL element having a cathode as a top electrode, and excelling in all of luminance efficiency, drive voltage, and operational life.

In order to achieve the aforementioned object, the organic electroluminescence element according to an implementation of the present invention is an organic electroluminescence element in which an anode, a luminescent layer of an organic material, and a cathode are laminated in sequence, on a substrate, the organic electroluminescence element includes: an electron injection layer formed between the luminescent layer and the cathode, for injecting electrons into the luminescent layer, the electron injection layer being a metal having, as a primary component, at least either one of an alkaline metal or an alkaline earth metal; and a fullerene layer including fullerenes, formed between the electron injection layer and the cathode, wherein the fullerene layer includes at least either one of an alkaline metal or an alkaline earth metal, wherein the alkaline metal or the alkaline earth metal included in the fullerene layer has a lower work function than a Lowest Unoccupied Molecular Orbit (LUMO) energy level of the fullerenes.

Accordingly, since the fullerenes have excellent conductivity, the layer including fullerenes can efficiently transport electrons from the transparent cathode of ITO, and the like, towards the luminescent layer. Furthermore, fullerenes have a high resistance to plasma and heat, and can protect the luminescent layer which is the foundation layer. Furthermore, since fullerenes have superior optical transparency than metal, the layer including fullerenes can efficiently retrieve, from the transparent cathode-side, the EL luminescence generated at the luminescent layer. However, there is the disadvantage of the optical quenching of the luminescence of the luminescent layer when fullerenes come into direct contact with the luminescent layer, and the disadvantage that fullerenes do not have sufficient capability for injecting electrons to the organic layer. In order to solve the aforementioned problems, a layer including an alkaline metal or an alkaline earth metal, which have excellent electron injection capability and do not cause optical quenching of the organic layer, is inserted between the layer including fullerenes and the luminescent layer, and thus the disadvantages of the layer including fullerenes can be prevented. In addition, since there is the advantage that the alkaline metal and alkaline earth metal do not oxidize even when fullerenes come into contact with these metals and, in addition, do not oxidize even when coming into contact with the transparent cathode including a conductive metal oxide, the layer including fullerenes can make stable contact with the layer including alkaline metal or alkaline earth metal, and the top electrode which is the transparent cathode.

In other words, since the fullerenes' conductivity, transparency, and effect of reducing process damage to the luminescent layer during transparent electrode film-forming, as well as the exceptional electron injecting performance of alkaline metal or alkaline earth metal can be obtained, and optical quenching which is the problem with fullerenes can be prevented by the interposition of the metal layer having at least either one of an alkaline metal or an alkaline earth metal as a primary component, it is possible to increase the luminescence efficiency, decrease the drive voltage, and improve the operational life of the organic EL element having a transparent cathode as a top electrode. In addition, by reducing process damage to the luminescent layer during the forming of the transparent electrode of fullerenes, it is possible to prevent the element from short-circuiting through pinholes within the luminescent layer created by the damage and becoming a black dot, and thus yield during production improves.

Furthermore, by including at least either one of an alkaline metal or an alkaline earth metal in the fullerene layer, the amount of light absorption of such layer decreases with the inclusion of at least either one of an alkaline metal or an alkaline earth metal in the layer including fullerenes, and thus the luminescence efficiency of the element improves. Furthermore, the role of alkaline metal or alkaline earth metal for doping into the fullerenes is to provide electrons to the fullerenes so as to generate free electrons. Therefore, as long as it is an alkaline metal or alkaline metal characterized in having a small (<3.5 eV) work function, its energy level is sufficiently lower than the Lowest Unoccupied Molecular Orbital (LUMO) energy level (3.5 eV) of fullerene, and thus most alkaline metals or alkaline earth metals are considered to accomplish this role. Accordingly, since conductivity is improved by the inclusion of at least either one of an alkaline metal or an alkaline earth metal in the layer including fullerenes, drive voltage can be reduced. Therefore, together with contributing to the reduction of power consumption, it is possible to reduce the amount of current to be supplied to the element for outputting light at a fixed luminance, and thus contribute to the improvement of the operational life of the element.

Furthermore, a blend ratio of the alkaline metal or the alkaline earth metal included in the fullerene layer is preferably in a range of 1 to 50 wt % inclusive, and more preferably in a range of 5 to 30 wt % inclusive.

When the blend ratio is low, the number of free electric charge within this film is low and conductivity is low, and thus the drive voltage of the element becomes high. However, there is almost no change in luminescence efficiency, thus making it suitable for use in cases where the improvement of drive voltage is not considered a problem. When the blend ratio is too high, at least either one of the alkaline metal or alkaline earth metal in the metal state proliferates, and absorption of light attributed thereto becomes substantial, and obtainment of high luminescence efficiency tends to become difficult.

Furthermore, the electron injection layer may be laminated in contact with a surface of the luminescent layer.

Accordingly, since there is no need to laminate an organic layer having an electron transporting function directly on top of the luminescent layer, it is possible to reduce the cost of materials and simplify the film-forming process.

Furthermore, the organic material may be a polymeric organic compound.

Accordingly, since an organic layer can be obtained by applying, through a wet process, the liquid solution or dispersion liquid obtained from dissolving an organic polymer in a solvent, a convenient process under atmospheric pressure can be used and material loss can be reduced. Accordingly, productivity can be improved.

Furthermore, the cathode may be a transparent electrode that allows transmission of light, the electron injection layer may have a thickness of between 1 nm and 20 nm inclusive, and the fullerene layer may have a thickness of between 1 nm and 100 nm inclusive.

Accordingly, with the top emission organic EL element in which luminescence is retrieved from the upper layer-side of the luminescent layer, it is possible to obtain high luminescence efficiency since the reflection of the luminescence from the luminescent layer, off of the electron injection layer, is suppressed, and absorption in the cathode is suppressed.

Furthermore, the alkaline metal or the alkaline earth metal included in the fullerene layer provides electrons to the fullerenes to generate free electrons within the fullerene layer.

Accordingly, since the conductivity of the fullerene layer improves, the drive voltage can be reduced.

Furthermore, the present invention can be implemented not only as an organic electroluminescence element having the aforementioned features, and has the same structure and effect even as a display panel including such organic electroluminescence element.

Furthermore, the present invention can be implemented, not only as an organic electroluminescence element having the aforementioned features, but also as a manufacturing method for an organic electroluminescence element, having the characteristic units included in the organic electroluminescence element as steps.

With the organic EL element of the present invention, electron injection from the transparent cathode to the luminescent layer is promoted, the luminescent layer is protected from damage during forming of the transparent cathode, and the electron injecting function and electron transporting function with high transparency is ensured, and thus it is possible to provide an organic EL element having a transparent cathode as a top electrode, and excelling in all of luminescence efficiency, drive voltage, and operational life.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 7 is a table of evaluation results for exemplary embodiments of the present invention.

DESCRIPTION OF THE PREFERRED EMBODIMENT(S)

In an organic electroluminescence element (hereafter called organic EL element) in the present embodiment, an anode, a luminescent layer of an organic material, and a cathode are laminated in sequence on a substrate; and a metal layer having at least either one of an alkaline metal or an alkaline earth metal as a primary component, and a fullerene layer including fullerenes, are laminated in sequence between the luminescent layer of an organic material and the cathode. The fullerene layer includes at least either one of an alkaline metal or an alkaline earth metal. Accordingly, since the fullerenes' conductivity, transparency, and effect of reducing process damage to the luminescent layer during forming of the transparent electrode, as well as the exceptional electron injecting performance of alkaline metal or alkaline earth metal can be obtained, and optical quenching which is the problem with fullerenes can be prevented by the interposition of the metal layer having at least either one of an alkaline metal or an alkaline earth metal as a primary component, it is possible to increase the luminescence efficiency, decrease the drive voltage, and improve the operational life of the organic EL element having a transparent cathode as a top electrode.

Hereinafter, an embodiment of the present invention shall be described in detail with reference to the Drawings.

Figure 1:
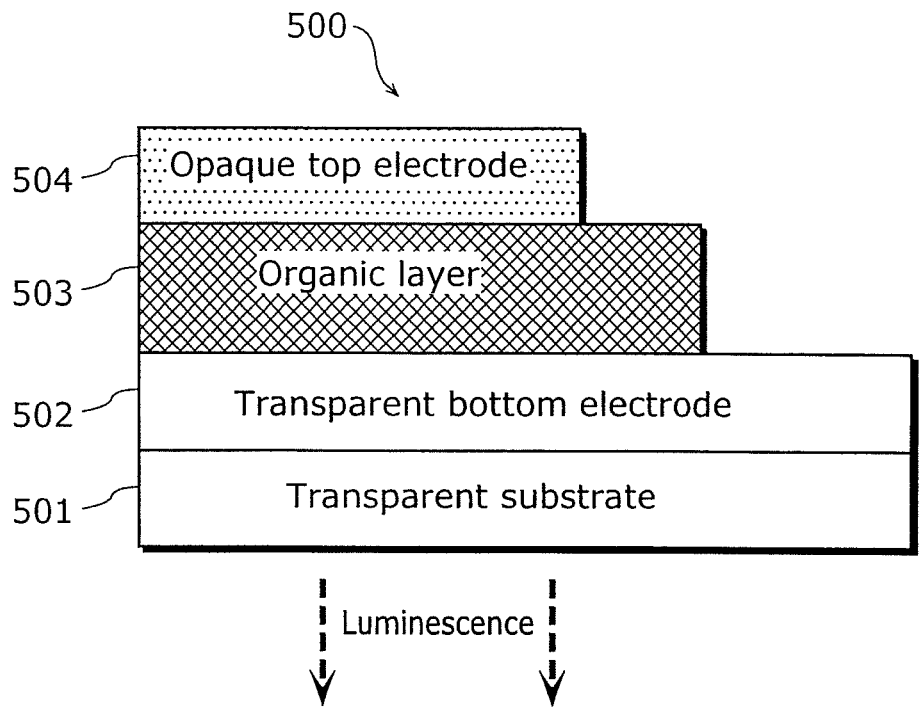
FIG. 1 is a structural cross-section view of the conventional organic EL element described in Non-Patent Reference 2.
Figure 2:
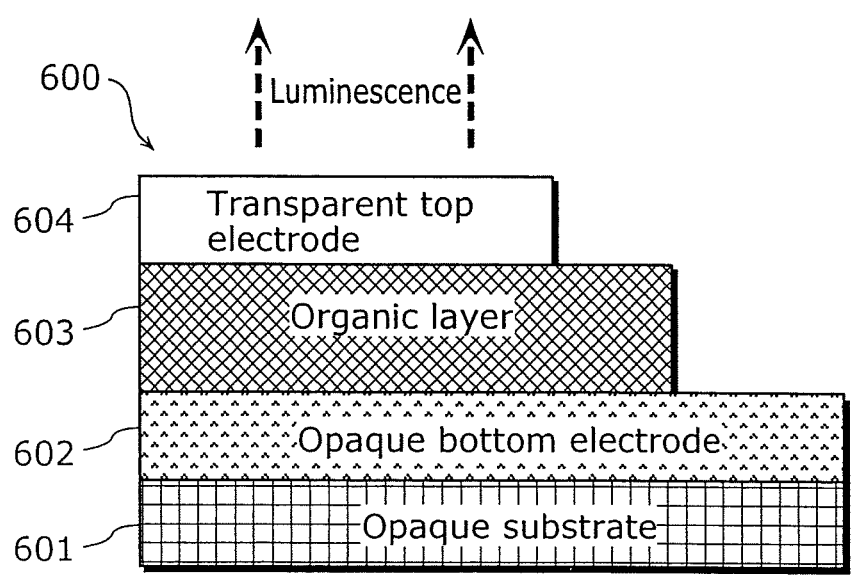
FIG. 2 is a structural cross-section view of the conventional organic EL element having a structure that allows the luminescence from the organic layer to be retrieved from the top electrode-side.
Figure 3:
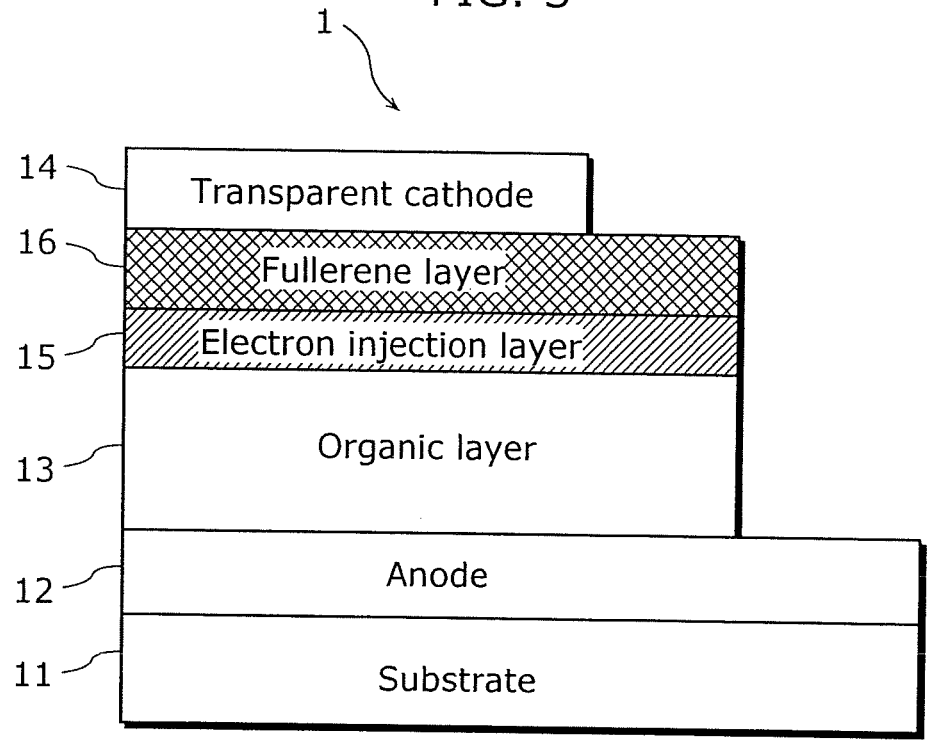
FIG. 3 is a structural cross-section view of an organic EL element in an embodiment of the present invention.

FIG. 3 is a structural cross-section view of an organic EL element in an embodiment of the present invention. An organic EL element 1 in the diagram includes a substrate 11, an anode 12, an organic layer 13, a transparent cathode 14, an electron injection layer 15, and a fullerene layer 16.

Although not limited to the following, a glass substrate, a quartz substrate, and the like, for example, can be used for the substrate 11. Furthermore, it is also possible to add bendability to the organic EL element by using a plastic substrate such as polyethylene terephthalate and polyethersulfone. The structure of the present invention, as described thus far, allows the use of an opaque plastic substrate or metal substrate since the effect particularly on a top emission organic EL element is significant. Furthermore, metal wiring and a transistor circuit for driving the organic EL may be formed on the substrate.

For the anode 12, a reflective metal can be used, although the material is not particularly limited to such. For example, it is possible to use: one of the metals silver, aluminum, nickel, chrome, molybdenum, copper, iron, platinum, tungsten, lead, tin, antimony, strontium, titanium, manganese, indium, zinc, vanadium, tantalum, niobium, lanthanum, cerium, neodymium, samarium, europium, palladium, cobalt, and silicon; an alloy of such metals; and a lamination of such metals.

Although not particularly limited to the following, for the organic layer 13, a hole injection layer, a hole transport layer, and a luminescent layer are formed in sequence from the anode 12. The hole injection layer has a function for steadily injecting holes injected from the anode 12, into the hole transport layer, or for injecting holes injected from the anode 12, into the hole transport layer, by supplementing hole generation. Furthermore, the hole transport layer has a function for transporting the holes injected from the hole injection layer to the luminescent layer. The luminescent layer has a function in which holes and electrons are injected and re-combined thereby generating an excited state and emitting light.

Note that the organic layer 13 may be of a single layer consisting of the luminescent layer, and may also be a lamination of layers including at least one layer of the luminescent layer. Furthermore, the organic layer 13 may include an inorganic layer as long as at least one layer of a luminescent layer is included. Furthermore, the organic layer 13 may be a low-molecular-weight organic compound, and may be a polymeric organic compound. It is preferable that a low-molecular-organic material is formed through a resistance heating deposition process, although the forming process is not particularly limited to such. Although not particularly limited to the following, it is preferable that a polymeric organic material is formed through: a casting process represented by spin casting from liquid solution, and the like; a coating process represented by deep coating, and the like; or a wet printing process represented by the inkjet process.

By using a polymeric organic compound for the organic layer 13, the organic layer can be obtained by applying, through a wet process, the liquid solution or dispersion liquid obtained from dissolving an organic polymer in a solvent, and thus a convenient process under atmospheric pressure can be used and material loss can be reduced. Accordingly, productivity can be improved.

The electron injection layer 15 has a function for steadily injecting electrons injected from the cathode-side, into the organic layer 13, or for injecting electrons injected from the cathode-side, into the organic layer 13, by supplementing electron generation. Furthermore, the electron injection layer 15 is a metal layer having, as a primary component, at least either one of an alkaline metal or an alkaline earth metal, and may include two or more types of alkaline metal or alkaline earth metal. This includes the case where both an alkaline metal and an alkaline earth metal are included. Furthermore, although the material is not particularly limited to the following, it is preferable that lithium, rubidium, cesium, calcium, or barium is used for the electron injection layer 15.

The thickness of this layer is preferably between 1 to 20 nm inclusive, and more preferably between 3 to 7 nm inclusive. When the electron injection layer 15 is too thin, the electron injection layer 15 is easily deteriorated by water and oxygen existing residually or entering from outside during deposition of an upper layer, thus making it difficult to obtain low voltage and high-efficiency characteristics. When this layer is too thick, it becomes difficult to obtain high luminescence efficiency as the luminescence generated at the organic layer is absorbed or trapped inside the element since these layers are fundamentally metal films that do not transmit light.

Note that, with the electron injection layer 15, materials other than the alkaline metal element and alkaline earth metal element may be mixed-in as necessary. For example, the inclusion and alloying with aluminum, and the like, contributes to improving the stability of the electrode. Although the forming process is not particularly limited to the following, it is preferable that such electron injection layer 15 including materials other than the alkaline metal element and alkaline earth metal element are formed through resistance heating deposition or electron beam deposition.

Note that by laminating the electron injection layer 15 directly on top of the luminescent layer, the lamination of an organic layer having an electron transporting function is eliminated thereby reducing the cost of materials and simplifying the film-forming process.

The fullerene layer 16 includes fullerenes. Although not particularly limited to the following, it is preferable that C60 or C70 is used for the fullerene layer 16. Here, fullerenes refer to: globular molecules having a carbon structure and represented by C60 and C70; molecules including metal within such sphere; or molecules in which an organic substituent group such as nitrogen, hydrogen and the methyl group are introduced.

The fullerene layer 16 has high damage-resistance against sputter and plasma.

Furthermore, in general, the fullerene layer 16 has conductivity and, although having better transparency than metal, exhibits absorption of visible light. Therefore, when the fullerene layer 16 is too thick, light is absorbed, which is undesirable. Furthermore, when too thin, the function for protecting the organic layer 13 from process damage during the forming of the transparent cathode 14 of ITO, and the like, deteriorates. Therefore, the thickness of the fullerene layer is preferably between 1 to 100 nm inclusive, and more preferably in the range of 5 to 50 nm inclusive.

Although not particularly limited to the following, it is preferable to form the fullerene layer 16 through a vacuum deposition process using resistance heating.

Although not particularly limited to the following, indium tin oxide or indium zinc oxide is used for the transparent cathode 14. Although not particularly limited to the following, it is preferable that such transparent cathode 14 represented by indium tin oxide or indium zinc oxide are formed through the various types of sputtering such as DC, RF, magnetron, or ECR, or through a plasma-assisted deposition process.

Figure 4:
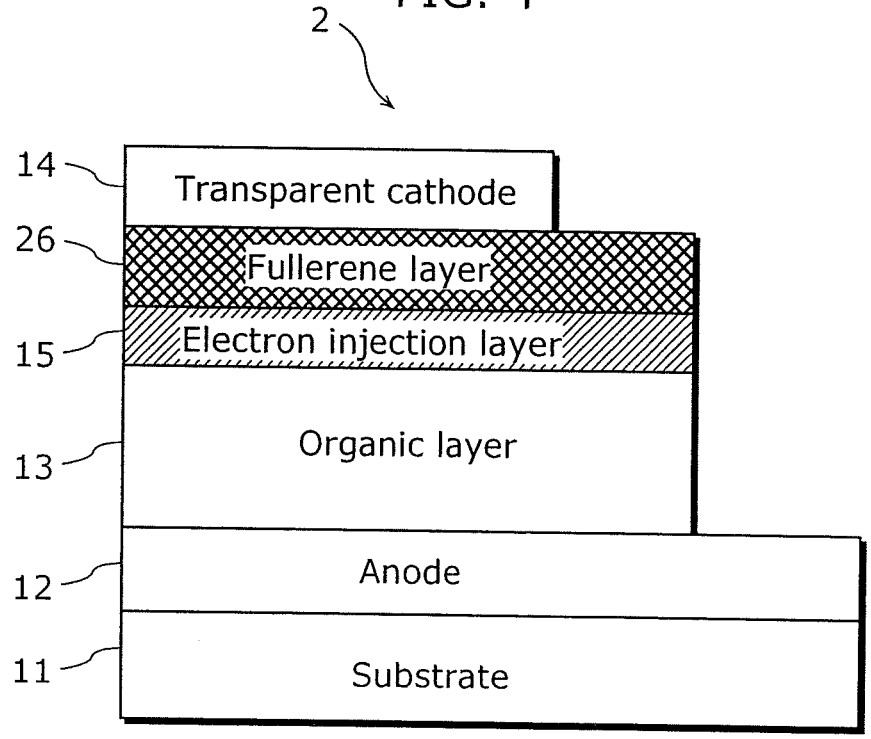
FIG. 4 is a structural cross-section view of an organic EL element, showing a modification in the embodiment of the present invention.

FIG. 4 is a structural cross-section view of an organic EL element, showing a modification in the embodiment of the present invention. An organic EL element 2 in the diagram includes the substrate 11, the anode 12, the organic layer 13, the transparent cathode 14, the electron injection layer 15 of an alkaline metal or an alkaline earth metal, and a fullerene layer 26 including fullerenes.

Compared to the organic EL element 1 described in FIG. 3, the organic EL element 2 described in FIG. 4 is structurally different only in terms of the fullerene layer. Thus, description of identical points shall be omitted and only the points of difference shall be described.

In the fullerene layer 26, at least either one of an alkaline metal or an alkaline earth metal is mixed-in. This is effective in increasing the conductivity of the fullerene, and reducing drive voltage. Furthermore, since the amount of light absorbed by the fullerene layer 26 is reduced, the luminescence efficiency of the element improves. Therefore, together with contributing to the reduction of power consumption, it is possible to reduce the amount of current to be supplied to the element for outputting light at a fixed luminance, and thus contribute to the improvement of the operational life of the element. The blend ratio of the alkaline metal or alkaline earth metal is preferably in the range of 1 to 50 wt % inclusive, and more preferably in the range of 5 to 30 wt % inclusive. When the blend ratio is low, the number of free electric charge within this film is low and conductivity is low, and thus the drive voltage of the element becomes high. However, there is almost no change in luminescence efficiency, thus making it suitable for use in cases where the improvement of drive voltage is not considered a problem. When the blend ratio is too high, at least either one of the alkaline metal or alkaline earth metal in the metal state proliferates, and absorption of light attributed thereto becomes substantial, and obtainment of high luminescence efficiency tends to become difficult.

Although not particularly limited to the following, it is preferable that the layer in which fullerene is doped with at least either one of an alkaline metal or alkaline earth metal, is formed through a co-deposition process using resistance heating.

Furthermore, the fullerene layer 26 may include two or more types of alkaline metal or alkaline earth metal. This includes the case where both an alkaline metal and an alkaline earth metal are included.

Note that in the fullerenes in the modification in the embodiment of the present invention, fullerenes including at least either one of an alkaline metal or an alkaline earth metal can also be used. Since the fullerenes including the aforementioned metal is already in the n-doped state, there is no need for the co-deposition of the fullerenes and the metal, thus contributing to the simplification of the manufacturing process.

EXAMPLES

Next, the present invention shall be described while citing examples and comparative examples.

Example 1

Figure 5:
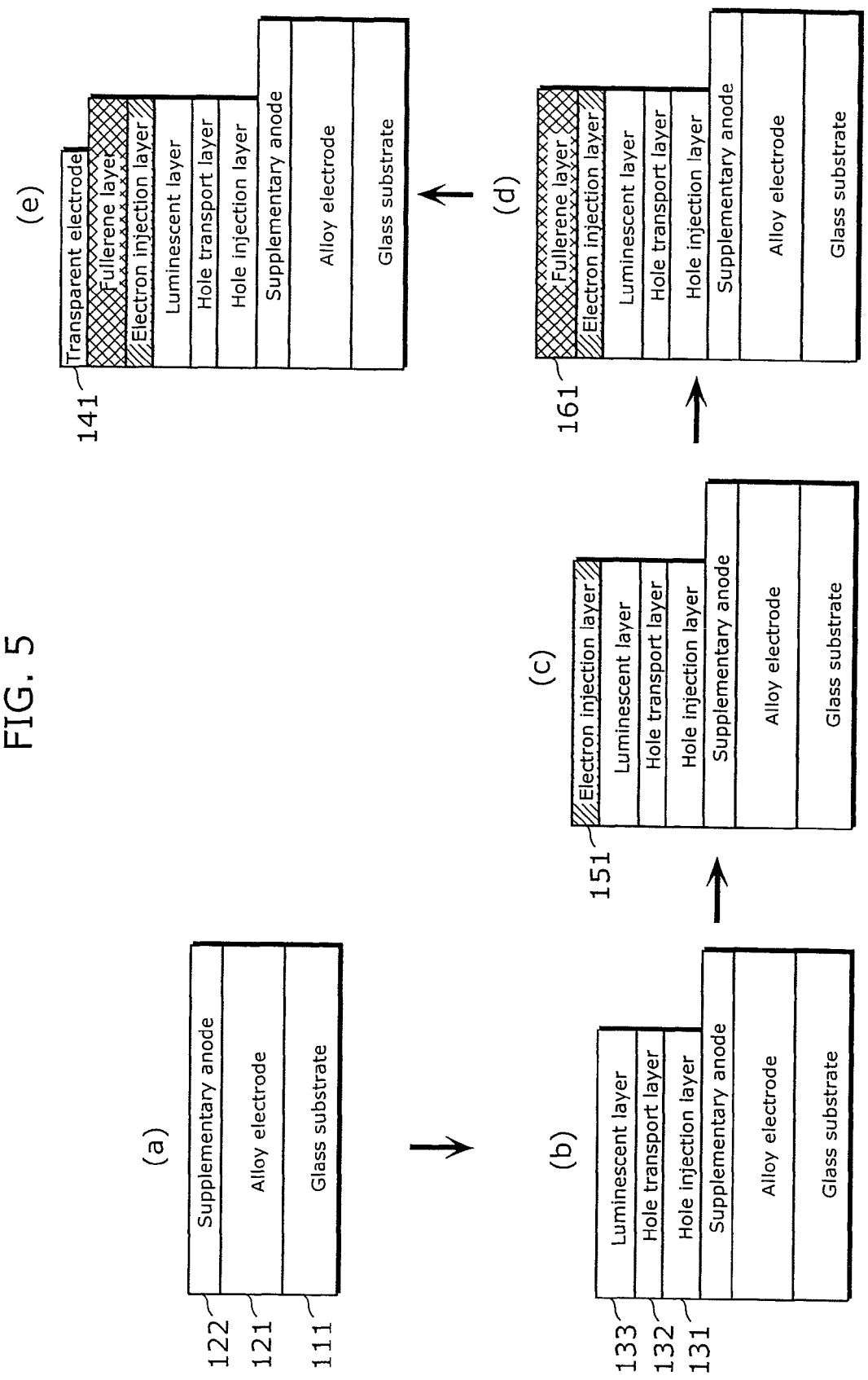
FIG. 5 is a process diagram describing a manufacturing method for the organic EL element in example 1 of the present invention.

FIG. 5 is a process diagram describing the manufacturing method for the organic EL element in example 1 of the present invention. First, a 100-nm-thick, 97% molybdenum and 3% chrome alloy electrode 121 was formed on the surface of a glass substrate 111 (using flat glass manufactured by Matsunami Glass Ind. Ltd.) by sputtering. Then, the alloy electrode 121 was patterned into the anode shape by photolithography. Next, as a supplementary anode 122, a 60-nm-thick indium tin oxide electrode was formed on the surface of the patterned alloy electrode 121 by sputtering, and patterned into a predetermined anode shape by photolithography (FIG. 5(a)). The patterned alloy electrode 121 and supplementary anode 122 each have the function of an anode.

Next, the following three layers were formed as the organic layer. First, a 60-nm-thick hole injection layer 131 was formed by forming polyethylenedioxythiophene (PEDOT: Baytron P AI 4083 manufactured by TA Chemical Co.) on the surface of the patterned supplementary anode 122 by spin coating, then heating it at 200 decrees Celsius for 10 minutes on a hot plate. Next, a 20-nm-thick hole transport layer 132 was formed by forming an HT12 (manufactured by Sumation) toluene solution on the surface of the hole injection layer 131 by spin coating, then heating it at 200 degrees Celsius for 30 minutes on a hot plate in nitrogen. Next, a 70-nm-thick luminescent layer 133 was formed by forming a Lumation Green (manufactured by Sumation) xylene solution on the surface of the hole transport layer 132 by spin coating, then heating it at 130 degrees Celsius for 10 minutes on a hot plate (FIG. 5(b)).

Next, a 5-nm-thick electron injection layer 151 was formed by the deposition of barium (manufactured by Aldrich; not less than 99% purity) on the surface of the luminescent layer 133 through vacuum-deposition (FIG. 5(c)).

Next, a 10-nm-thick fullerene layer 161 was formed by the deposition of C60 (manufactured by Aldrich; not less than 99.9% purity) on the surface of the electron injection layer 151 through vacuum-deposition (FIG. 5(d)).

Lastly, a 100-nm-thick transparent cathode 141 was formed by the deposition of indium oxide on the surface of the fullerene layer 161 through plasma-assisted deposition (using a film manufacturing apparatus manufactured by Sumitomo Heavy Industries, Ltd.) (FIG. 5(e)).

Example 2

In the manufacturing method for the organic EL element in example 2 of the present invention, the organic EL element was formed in the same manner as in example 1 except that the fullerene layer was formed by changing the thickness of the fullerene layer 161 described in FIG. 5, from 10 nm to 20 nm.

Example 3

In the manufacturing method for the organic EL element in example 3 of the present invention, the organic EL element was formed in the same manner as in example 1 except that the fullerene layer was formed by changing the thickness of the fullerene layer 161 described in FIG. 5, from 10 nm to 50 nm.

Example 4

In the manufacturing method for the organic EL element in example 4 of the present invention, the organic EL element was formed in the same manner as in example 1 except that, in place of the fullerene layer 161 described in FIG. 5, a 10-nm-thick fullerene layer was formed by co-deposition of C60 (manufactured by Aldrich; not less than 99.9% purity) and 20 wt % barium (manufactured by Aldrich; not less than 99% purity) by vacuum-deposition. In this forming of the fullerene layer by co-deposition, the C60 and barium films were formed simultaneously through resistance heating deposition and electron beam deposition, respectively. During this simultaneous film-forming, it is possible to obtain a fullerene layer having the desired barium content by controlling the electron beam deposition, which allows easy control of film-forming speed, to match the film-forming speed of the resistance heating deposition for which film-forming speed is not easily controlled.

Example 5

In the manufacturing method for the organic EL element in example 5 of the present invention, the organic EL element was formed in the same manner as in example 1 except that, in place of the fullerene layer 161 described in FIG. 5, a 20-nm-thick fullerene layer was formed by co-deposition of C60 (manufactured by Aldrich; not less than 99.9% purity) and 20 wt % barium (manufactured by Aldrich; not less than 99% purity) by vacuum-deposition. In this forming of the fullerene layer by co-deposition, the C60 and barium films are formed simultaneously through resistance heating deposition and electron beam deposition, respectively.

Example 6

In the manufacturing method for the organic EL element in example 6 of the present invention, the organic EL element was formed in the same manner as in example 1 except that, in place of the fullerene layer 161 described in FIG. 5, a 50-nm-thick fullerene layer was formed by co-deposition of C60 (manufactured by Aldrich; not less than 99.9% purity) and 20 wt % barium (manufactured by Aldrich; not less than 99% purity) by vacuum-deposition. In this forming of the fullerene layer by co-deposition, the C60 and barium films are formed simultaneously through resistance heating deposition and electron beam deposition, respectively.

Comparative Example 1

In the manufacturing method for the organic EL element in comparative example 1 in the present invention, the organic EL element was formed in the same manner as in example 1 except that ITO which is the transparent cathode was directly formed on the surface of the barium layer which is the electron injection layer, without laminating the fullerene layer 161 described in FIG. 5 (without executing FIG. 5(*d*)).

Comparative Example 2

In the manufacturing method for the organic EL element in comparative example 2 in the present invention, the organic EL element was formed in the same manner as in example 1 except that, in place of the fullerene layer 161 described in FIG. 5, a 20-nm-thick mixed layer of tris (8-quinolinolato) aluminum (hereafter called Alq), which is widely used as an electron transport layer for organic EL elements, and 20 wt % barium (manufactured by Aldrich; 99% purity) was formed.

Comparative Example 3

In the manufacturing method for the organic EL element in comparative example 3 in the present invention, the organic EL element was formed in the same manner as in example 5 except that the electron injection layer 151 described in FIG. 5 was not laminated (FIG. 5(*c*) was not executed).

Evaluation of the Examples and Comparative Examples

With the above-described examples 1 to 6 and comparative examples 1 to 3, by measuring the drive voltage and luminance when a current of 10 mA/cm$^2$ is applied to the element, with the alloy electrode 121 and the supplementary anode 122 being positive and the transparent cathode 141 being negative, it is possible to obtain the drive voltage and luminescence efficiency at that time. In addition, the attenuation of luminance when the respective elements are made to emit light of 4000 cd/m$^2$ and are driven continually by a fixed current is measured, and the time-period in which luminance is reduced by half (2000 cd/m$^2$) is assumed to be the operational life. FIG. 7 indicates the respective evaluation results for examples 1 to 6 and comparative examples 1 to 3.

In FIG. 7, the respective MoCr alloy electrodes all have a thickness of 100 nm, the respective ITO supplementary electrodes all have a thickness of 60 nm, the respective PEDOT hole injection layers all have a thickness of 80 nm, the respective IL hole transport layers all have a thickness of 20 nm, the respective EML luminescent layers all have a thickness of 75 nm, the respective Ba electron injection layers all have a thickness of 5 nm, and the respective ITO transparent electrodes all have a thickness of 100 nm.

In examples 1 to 3, the respective organic EL elements in which barium is used in the electron injection layer 151 and C60 is used in the fullerene layer, all have low drive voltage and good luminescence efficiency. The organic EL element exhibiting the best drive voltage, luminescence efficiency, and element operational life is the case in example 2 in which 20-nm-thick C60 is used as the fullerene layer. In the case of example 1 in which the thickness of the fullerene layer 161 is 10 nm, luminescence efficiency and element operational life is low compared to the case in example 2 in which the thickness of the fullerene layer is 20 nm. This is considered to be due to the slight remainder of process damage to the luminescent layer 133 when the transparent cathode 141 represented by ITO is formed. In the case of example 3 in which the thickness of the fullerene layer is 50 nm, drive voltage is higher than in the case of example 2, and luminescence efficiency and element operational life are low. This is considered to be due to the rise of resistance in the fullerene layer brought about by the thickening of the film, and the deterioration of luminescence efficiency due to the light absorption of fullerene. However, in the case of examples 1 to 3, all the organic EL elements are capable of stable and good operation.

In examples 4 to 6, the respective organic EL elements including the electron injection layer 151 of barium and the fullerene layer in which C60 and 20 wt % barium are mixed, all have low drive voltage and good luminescence efficiency. Compared with examples 1 to 3, the elements in examples 4 to 6 exhibit an even lower drive voltage, and the rise in drive voltage due to the thickening of the fullerene level is small. This is considered to be derived from the fact that, in the fullerene layer, by mixing the alkaline earth metal barium into C60, free electrons are generated within the C60 film thus lowering resistance in the film. In addition, compared to the elements in examples 1 to 3, the elements in examples 4 to 6 have increased luminescence efficiency. This is considered to be due to the reduction of absorption in C60 due to the doping thereof with barium which is an alkaline earth metal. From the forgoing, it is possible to improve device characteristics by mixing alkaline metal or alkaline earth metal into the fullerene.

In comparative example 1, since there is no fullerene layer, the barium and luminescent layers are damaged by the ITO and, as a result, drive voltage, luminescence efficiency, and operational life deteriorate significantly. Therefore, in order to obtain the effects of the present invention, the fullerene layer is indispensable.

Comparative example 2 uses, in place of the fullerene layer, a layer in which alkaline metal or alkaline earth metal is mixed into the conventional low-molecular-weight organic material. In this case, luminescence efficiency is good, however drive voltage, luminescence efficiency, and operational life is inferior to those in the examples. This is because, although damage to the luminescent layer 133 is reduced, significant sputtering damage is incurred by the layer in which alkaline metal or alkaline earth metal is mixed into the low-molecular-weight organic material. Therefore, the lamination structure of the electron injection layer and the fullerene layer of the present invention produces an effect of improving device performance beyond that which is conventional.

In comparative example 3, since there is no electron injection layer, the drive voltage of the organic EL element rises and the luminescence from the luminescent layer is optically-quenched by the layer including fullerenes, and thus luminescence efficiency significantly deteriorates. Therefore, in order to obtain the effects of the present invention, it is necessary to have an electron injection layer which is a metal layer having, as a primary component, at least either one of an alkaline metal or an alkaline earth metal.

With an organic EL element for a display device, luminescence efficiency, drive voltage, and operational life, which are performance evaluation items thereof, need to be good. Accordingly, as in comparative examples 1 to 3, even when either of the fullerene layer or the electron injection layer is formed between the luminescent layer and the transparent cathode, satisfactory values for all the aforementioned three evaluation items cannot be obtained.

It is possible to realize a display device that can obtain satisfactory values for all of the aforementioned three evaluation items only in the case where an electron injection layer which is a metal having at least either one of an alkaline metal or an alkaline earth metal as a primary component, and a fullerene layer, are formed in sequence between the luminescent layer and the transparent cathode, as in examples 1 to 6.

As described thus far, in the case of a structure in which a cathode is the top electrode, the organic electroluminescence element in the present invention adopts a structure in which a metal layer having at least either one of an alkaline metal or an alkaline earth metal as a primary component, and a layer including fullerenes, are formed in sequence between a luminescent layer of an organic material, which is the lower layer, and a cathode which is the upper layer. By adopting this structure, it is possible to obtain (1) the fullerenes' conductivity, transparency, and effect of reducing process damage to the organic layer during transparent cathode forming, and (2) the excellent electron injecting performance of an alkaline metal or an alkaline earth metal. In addition, through the interposition of a layer including alkaline metal or alkaline earth metal, it is possible to (3) prevent optical quenching which is the problem with fullerenes. Therefore, it is possible to raise the luminescence efficiency, lower the drive voltage, and improve the operational life of the organic EL element having a transparent cathode as a top electrode. In addition, through the mixing of alkaline metal or alkaline earth metal in the layer including fullerenes, it is possible to (4) raise the conductivity of fullerene and lower drive voltage. Furthermore, (5) since the amount of light absorption of the layer including fullerenes decreases, the luminescence efficiency of the element increases.

Note that although examples using a polymeric material in the hole injection layer, the hole transport layer, and the luminescent layer, are shown in the embodiment of the present invention, the same result as in the present study can be obtained even when a low-molecular-weight material is used.

Furthermore, the combination for the organic layer is not limited to those exemplified in the present embodiment, and the hole injection layer may be omitted, or an electron transport layer may be inserted, for example.

Furthermore, yet another layer may be provided between the electron injection layer of an alkaline metal or alkaline earth metal, and the luminescent layer. The insertion of a layer of electron transporting organic material can be given as an example.

Furthermore, yet another layer may be provided between the electron injection layer of an alkaline metal or alkaline earth metal, and the fullerene layer including fullerenes.

Note that although described as the structure for a top emission organic EL element thus far, the structure of the present invention can be suitably used as a part of the structure in the case where the top electrode of a bottom emission organic EL element is a cathode. A structure of Ba/(C60+Ba)/Al on top of the luminescent layer, and the like, can be given as an example. In this case, although transparency is not required from a cathode-side layer higher than the luminescent layer, an electron injecting function, an electron transporting function, and a function for protecting the luminescent layer from damage during the forming of Al film, are required. Therefore, in the same manner as when used as a top emission organic EL element, the electron injection layer and the fullerene layer of the present invention also produce sufficient effect when used in a bottom emission organic EL element.

Note that although the same element, namely barium, is used in either of the alkaline metal or alkaline earth metal composing the electron injection layer, and the alkaline metal or alkaline earth metal included in the fullerene layer, different alkaline metals or alkaline earth metals may be used. From a manufacturing process viewpoint, it is preferable that both are of the same metal element. In example 4, barium is used as the constituent metal of the electron injection layer, and barium is used as the contained metal in the fullerene layer. Furthermore, during the forming of the fullerene layer, fullerene and barium are formed into a film through co-deposition. In this case, although fullerene is already deposited at a fixed speed during the forming of the electron injection layer, forming on the substrate is prevented by a shutter above the fullerene source. Then, by opening the shutter for fullerenes at the start of fullerene layer forming after the deposition of barium which is the electron injection layer, it is possible to reduce the tact time during movement from the electron injection layer forming stage to the fullerene layer forming stage, and reduce the entrapment of impurities in the interface of the electron injection layer and the fullerene layer.

On the other hand, from the viewpoint of element characteristics, the optimal constituent metal for the electron injection layer and the optimal contained metal in the fullerene layer are generally considered to be different. In the case where an organic polymeric material is used as a luminescent layer, the degree of diffusion to the luminescent layer of an organic polymeric material is smallest for barium, among the alkaline metals and alkaline earth metals. In general, the diffusion of metal to the luminescent layer shortens the operational life of the element. Therefore, barium is the most preferable as the alkaline metal or alkaline earth metal for the electron injection layer.

Furthermore, the role of alkaline metal or alkaline earth metal for doping into the fullerenes is to provide electrons to the fullerenes so as to generate free electrons. Therefore, as long as it is an alkaline metal or alkaline metal characterized in having a small (<3.5 eV) work function, its energy level is sufficiently lower than the Lowest Unoccupied Molecular Orbital (LUMO) energy level (3.5 eV) of fullerene, and thus most alkaline metals or alkaline earth metals are considered to accomplish this role.

Note that although barium, which is an alkaline earth metal, is used as the constituent metal for the electron injection layer and the contained metal in the fullerene layer in the above-described examples 1 to 6, an alkaline metal produces an equivalent effect as an alkaline earth metal. In particular, an alkaline metal, as in an alkaline earth metal, is a metal having a small work function and, in the same manner as an alkaline earth metal, an alkaline metal can easily provide electrons to fullerene through mixing, so as to generate free electrons within the film.

Figure 6:
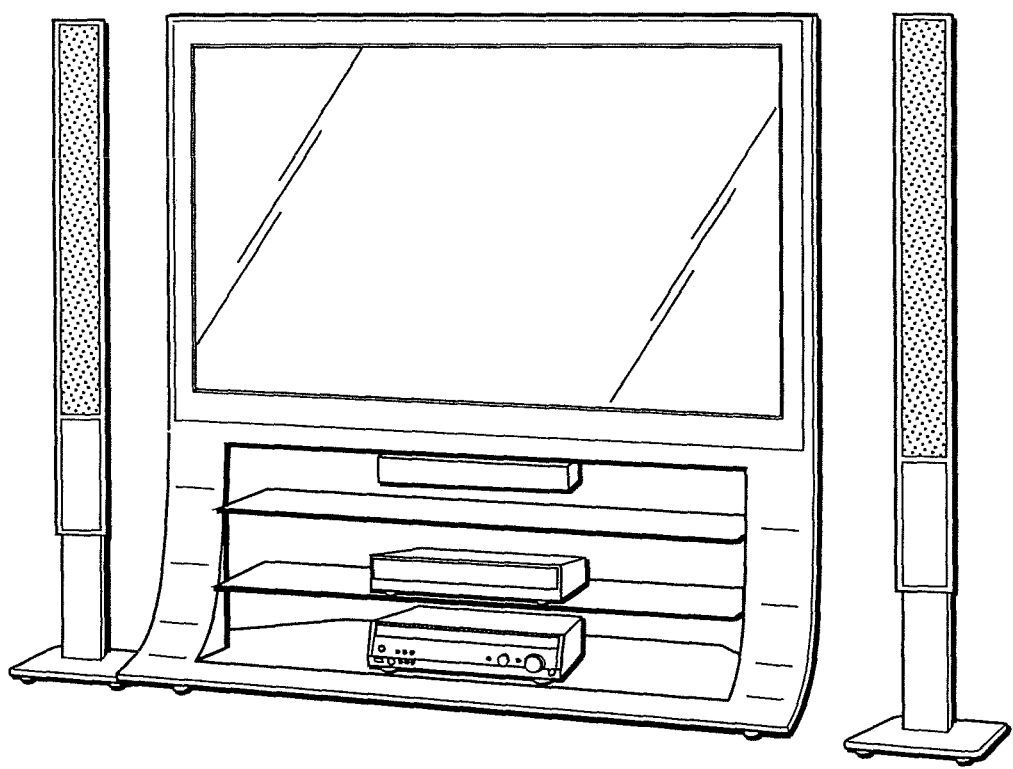
FIG. 6 is an external view of a television using the organic EL element of the present invention.

Note that the electrode included in the organic EL element in the present invention may be evenly formed on the entire surface or on the majority of the surface of the substrate. In this case, since large-area luminescence can be obtained, the organic EL element can be used in applications for lighting and the like. Alternatively, the electrode may be patterned so as to allow the display of a particular figure or letter. In this case, since luminescence in a characteristic pattern can be obtained, the organic EL element can be used for advertising displays and the like. Alternatively, the electrode may be arranged, in a plurality, in the form of a matrix. In this case, the organic EL element can be used in applications for passive-drive display panels and the like. Alternatively, the electrode can be formed, on a substrate in which a transistor array is arranged, so as to obtain an electrical connection that corresponds to the transistor array. In this case, the organic EL element can be used in applications for active-drive display panels and the like, as represented by the television described in FIG. 6.

Although the organic EL element and the manufacturing method thereof according to the present invention have been described based on the embodiment and examples, the present invention is not limited to such. As long as they do not depart from the essence of the present invention, various modifications to the present embodiment which may be conceived by those skilled in the art are intended to be included within the scope of this invention.

INDUSTRIAL APPLICABILITY

The organic EL element according to the present invention is useful as a pixel luminescence source of a display device, a backlight of a liquid-crystal display, a light-source for various lighting, a light source of an optical device, and so on, and is particularly suitable for application to a TFT-combined active matrix organic EL display panel.

What is claimed is:
1. An organic electroluminescence element, comprising:
an anode over a substrate;
a luminescent layer over the anode, the luminescent layer comprising an organic material;
an electron injection layer over the luminescent layer for injecting electrons into the luminescent layer, the electron injection layer being a metal including at least one of an alkaline metal and an alkaline earth metal;
a fullerene layer over the electron injection layer, the fullerene layer including fullerenes and at least one of an alkaline metal and an alkaline earth metal; and
a cathode over the fullerene layer,
wherein the at least one of the alkaline metal and the alkaline earth metal included in the fullerene layer has a lower work function than a lowest unoccupied molecular orbit energy level of the fullerenes.
2. The organic electroluminescence element according to claim 1, wherein the at least one of the alkaline metal and the alkaline earth metal included in the fullerene layer has a blend ratio in a range of approximately 1 to approximately 50 weight percent.
3. The organic electroluminescence element according to claim 1, wherein the electron injection layer is directly on the luminescent layer.
4. The organic electroluminescence element according to claim 1, wherein the organic material comprises a polymeric organic compound.
5. The organic electroluminescence element according to claim 1,
wherein the cathode is a light transmissive electrode for transmitting light,
the electron injection layer has a thickness in a range of approximately 1 nm to approximately 20 nm, and
the fullerene layer has a thickness in a range of approximately 1 nm to approximately 100 nm.
6. The organic electroluminescence element according to claim 1, wherein at least one of the alkaline metal and the alkaline earth metal included in the fullerene layer provides electrons to the fullerenes to generate free electrons within the fullerene layer.
7. A display panel comprising the organic electroluminescence according to claim 1.
8. A method of manufacturing an organic electroluminescence element, comprising:
providing a luminescent layer on an anode, the luminescent layer comprising an organic material;
providing an electron injection layer on the luminescent layer for injecting electrons into the luminescent layer, the electron injection layer being a metal including at least one of an alkaline metal and an alkaline earth metal;

providing a fullerene layer on the electron injection layer, the fullerene layer including fullerenes and at least one of an alkaline metal and an alkaline earth metal; and providing a cathode on the fullerene layer, wherein the at least one of the alkaline metal and the alkaline earth metal included in the fullerene layer has a lower work function than a lowest unoccupied molecular orbit energy level of the fullerenes.

9. The method according to claim 8, wherein the fullerene layer is provided on the electron injection layer by resistive heating vapor deposition of the fullerenes, and by electron beam vapor deposition of the at least one of the alkaline metal and the alkaline earth metal to increase conductivity of the fullerenes, at a deposition rate corresponding to a deposition rate for the fullerenes and in a vacuum chamber in which the fullerenes are vapor-deposited.

10. The method according to claim 8, wherein the at least one of the alkaline metal and the alkaline earth metal included in the fullerene layer has a blend ratio in a range of approximately 1 to approximately 50 weight percent.

11. The method according to claim 8, wherein the organic material comprises a polymeric organic compound.

12. The method according to claim 8, wherein the cathode is a light transmissive electrode for transmitting light, the electron injection layer has a thickness in a range of approximately 1 nm to approximately 20 nm, and the fullerene layer has a thickness in a range of approximately 1 nm to approximately 100 nm.

13. The method according to claim 8, wherein at least one of the alkaline metal and the alkaline earth metal included in the fullerene layer provides electrons to the fullerenes to generate free electrons within the fullerene layer.

14. An organic electroluminescence element prepared by a process, comprising:

providing a luminescent layer on an anode, the luminescent layer comprising an organic material;

providing an electron injection layer on the luminescent layer for injecting electrons into the luminescent layer, the electron injection layer being a metal including at least one of an alkaline metal and an alkaline earth metal;

providing a fullerene layer on the electron injection layer, the fullerene layer including fullerenes and at least one of an alkaline metal and an alkaline earth metal, by resistive heating vapor deposition of the fullerenes, and by electron beam vapor deposition of the at least one of the alkaline metal and the alkaline earth metal to increase conductivity of the fullerenes, at a deposition rate corresponding to a deposition rate of the fullerenes and in a vacuum chamber in which the fullerenes are vapor-deposited; and providing a cathode on the fullerene layer.

15. An organic electroluminescence element, comprising:

an anode over a substrate;

a luminescent layer over the anode, the luminescent layer comprising an organic material;

an electron injection layer over the luminescent layer for injecting electrons into the luminescent layer, the electron injection layer being a metal including at least one of an alkaline metal and an alkaline earth metal;

a fullerene layer over the electron injection layer, the fullerene layer including fullerenes and an alkaline earth metal; and a cathode over the fullerene layer, wherein the alkaline earth metal included in the fullerene layer has a lower work function than a lowest unoccupied molecular orbit energy level of the fullerenes.

16. The organic electroluminescence element according to claim 15, wherein the alkaline earth metal included in the fullerene layer is barium.

17. An organic electroluminescence element, comprising:

an anode over a substrate;

a luminescent layer over the anode, the luminescent layer comprising an organic material;

an electron injection layer over the luminescent layer for injecting electrons into the luminescent layer, the electron injection layer being a metal including at least one of an alkaline metal and an alkaline earth metal;

a fullerene layer over the electron injection layer, the fullerene layer including fullerenes and at least one of an alkaline metal and an alkaline earth metal; and a cathode over the fullerene layer, wherein the at least one of the alkaline metal and the alkaline earth metal included in the fullerene layer has a lower work function than a lowest unoccupied molecular orbit energy level of the fullerenes, and the metal included in the electron injection layer and the metal included in the fullerene layer are the same metal element.

* * * * *